US009627247B2

(12) United States Patent
Hsu et al.

(10) Patent No.: US 9,627,247 B2

(45) Date of Patent: Apr. 18, 2017

(54) SEMICONDUCTOR DEVICE AND METHOD OF FABRICATING THE SAME

(71) Applicant: MACRONIX International Co., Ltd., Hsinchu (TW)

(72) Inventors: Fang-Hao Hsu, Hsinchu (TW); Hong-Ji Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/729,843

(22) Filed: Jun. 3, 2015

(65) Prior Publication Data

US 2016/0358810 A1 Dec. 8, 2016

(51) Int. Cl.

| | |
|---|---|
| ***H01L 29/00*** | (2006.01) |
| ***H01L 21/762*** | (2006.01) |
| ***H01L 21/311*** | (2006.01) |
| ***H01L 21/308*** | (2006.01) |
| ***H01L 21/02*** | (2006.01) |
| ***H01L 29/06*** | (2006.01) |

(52) U.S. Cl.

CPC .... *H01L 21/76229* (2013.01); *H01L 21/0214* (2013.01); *H01L 21/0217* (2013.01); *H01L 21/02164* (2013.01); *H01L 21/3086* (2013.01); *H01L 21/31144* (2013.01); *H01L 21/76232* (2013.01); *H01L 29/0649* (2013.01)

(58) Field of Classification Search

CPC ........... H01L 29/0649; H01L 21/76229; H01L 21/0214; H01L 21/02164; H01L 21/0217; H01L 21/3086; H01L 21/31144; H01L 21/76232

See application file for complete search history.

(56) References Cited

U.S. PATENT DOCUMENTS

| | | | | |
|---|---|---|---|---|
| 5,746,884 A * | 5/1998 | Gupta | H01L 21/76804 | 257/E21.578 |
| 6,034,409 A * | 3/2000 | Sakai | H01L 21/76232 | 257/506 |
| 6,040,597 A * | 3/2000 | Kim | H01L 21/76232 | 257/321 |
| 6,893,938 B2 * | 5/2005 | Naeem | H01L 21/76232 | 257/E21.232 |

(Continued)

OTHER PUBLICATIONS

"Office Action of Taiwan Counterpart Application," issued on Jun. 27, 2016, p. 1-p. 6.

*Primary Examiner* — Yosef Gebreyesus

(74) *Attorney, Agent, or Firm* — J. C. Patents

(57) ABSTRACT

Provided is a method of fabricating a semiconductor device, including the following. A first material layer, a second material layer and a mask layer are formed on a substrate. A portion of the second material layer is removed by performing a first etching process with the mask layer as a mask, so as to expose the first material layer and form a first pattern layer and a second pattern layer. A portion of the first material layer is removed by performing a second etching process with the mask layer as a mask, so as to expose a portion of the substrate. A portion of the substrate is removed by performing a third etching process with the mask layer as a mask, so as to form first trenches and second trenches. Sidewalls of the second trenches and a surface of the substrate form at least two different angles.

8 Claims, 7 Drawing Sheets

(56) References Cited

U.S. PATENT DOCUMENTS

| | | | | |
|---|---|---|---|---|
| 7,141,486 | B1 * | 11/2006 | Rossi | H01L 21/76232 257/E21.549 |
| 2007/0243693 | A1 * | 10/2007 | Nemani | H01L 21/76224 438/424 |
| 2009/0029523 | A1 * | 1/2009 | Seo | H01L 21/3081 438/425 |
| 2009/0261448 | A1 | 10/2009 | Mishra et al. | |
| 2010/0041207 | A1 * | 2/2010 | Lee | C23C 16/045 438/435 |
| 2010/0295147 | A1 * | 11/2010 | Wu | H01L 21/3086 257/506 |
| 2011/0198698 | A1 * | 8/2011 | Lee | H01L 27/11568 257/368 |
| 2014/0167206 | A1 * | 6/2014 | Wu | H01L 21/76 257/499 |
| 2016/0099324 | A1 * | 4/2016 | Chang | H01L 21/28114 257/401 |

* cited by examiner

SEMICONDUCTOR DEVICE AND METHOD OF FABRICATING THE SAME

BACKGROUND OF THE INVENTION

Field of the Invention

The invention relates to a semiconductor device and a method of fabricating the same.

Description of Related Art

As the integration of semiconductor devices increases, the device size continues to decrease. Since the size of each component in the device becomes smaller, the distance between the components is shortened as well. Generally, the devices are isolated from each other by an isolation structure. Nowadays, the more commonly used isolation structure is a shallow trench isolation (STI) structure. In a memory device, a suitable STI structure can increase the gate coupling ratio (GCR), reduce interference between adjacent memory devices, and at the same time maintain favorable reliability of the memory device.

The dense region and the peripheral region of the device have different environments. Therefore, when the aforementioned STI structure is fabricated, the patterning processes are usually performed separately such that the trenches formed in the dense region and the peripheral region for fabricating the isolation structure have similar contours. However, the problem of inaccurate alignment may occur during the separate patterning processes. Once inaccurate alignment occurs, the desired pattern cannot be formed. Thus, how to form trenches having similar contours in the dense region and the peripheral region of the device with fewer patterning processes is an issue that needs to be addressed.

SUMMARY OF THE INVENTION

The invention provides a fabricating method of a semiconductor device for forming trenches having similar contours in a dense region and a peripheral region of the device with fewer patterning processes.

The invention provides a fabricating method of a semiconductor device. The fabricating method of the semiconductor device includes the following. A first material layer is formed on a substrate. The substrate includes a first region and a second region, wherein the second region is located in a periphery of the first region. A second material layer is formed on the first material layer. A mask layer is formed on the second material layer. A portion of the second material layer is removed by performing a first etching process with the mask layer as a mask, so as to expose the first material layer and form a first pattern layer in the first region and form a second pattern layer in the second region. A portion of the first material layer is removed by performing a second etching process with the mask layer as a mask, so as to expose a portion of the substrate. A portion of the substrate is removed by performing a third etching process with the mask layer as a mask, so as to form a plurality of first trenches and a plurality of second trenches in the substrate. The first trenches are located in the substrate on two sides of the first pattern layer in the first region, and the second trenches are located in the substrate on two sides of the second pattern layer in the second region. At least two different angles are formed between a sidewall of the second trench and a surface of the substrate.

In an embodiment of the invention, the third etching process is performed such that at least a first angle and a second angle are formed between the sidewall of the second trench and the surface of the substrate, and a third angle and a fourth angle are formed between a sidewall of the first trench and the surface of the substrate. The first angle is an angle between an inner surface of an upper sidewall of the second trench and a first dividing line, the second angle is an angle between an inner surface of a lower sidewall of the second trench and a second dividing line, the third angle is an angle between an inner surface of an upper sidewall of the first trench and the first dividing line, and the fourth angle is an angle between an inner surface of a lower sidewall of the first trench and a third dividing line. The first dividing line is a line connecting dividing points between an upper portion and a lower portion of the second trench, the second dividing line is a line connecting bottoms of the second trenches, and the third dividing line is a line connecting bottoms of the first trenches. The first angle, the second angle, the third angle, and the fourth angle satisfy the following formula (1):

$$\text{Max}|\text{the third angle}-\text{the fourth angle}|<\text{Max}|\text{the first angle}-\text{the second angle}| \quad \text{formula (1).}$$

In an embodiment of the invention, the first angle is greater than the second angle.

In an embodiment of the invention, the third etching process is performed such that the third angle is greater than the first angle and the second angle, and the fourth angle is greater than the first angle and the second angle.

In an embodiment of the invention, the first etching process is performed such that a fifth angle and a sixth angle are formed between a sidewall of the second pattern layer and the surface of the substrate, and the fifth angle is different from the sixth angle. The fifth angle is an angle between an inner surface of an upper sidewall of the second pattern layer and a fourth dividing line, and the sixth angle is an angle between an inner surface of a lower sidewall of the second pattern layer and a fifth dividing line. The fourth dividing line is a line connecting dividing points between an upper portion and a lower portion of the second pattern layer, and the fifth dividing line is a line connecting an interface between the first material layer and the first pattern layer, and an interface between the first material layer and the second pattern layer.

In an embodiment of the invention, the fifth angle is smaller than the sixth angle.

In an embodiment of the invention, the fabricating method further includes forming a plurality of insulating layers filled into the first trenches and the second trenches.

In an embodiment of the invention, the fabricating method further includes forming a liner layer to cover the first pattern layer, the second pattern layer, the first material layer, and the substrate between the second etching process and the third etching process.

In an embodiment of the invention, a material of the liner layer includes silicon oxide, silicon nitride, silicon oxynitride, or a combination thereof.

In an embodiment of the invention, in the second etching process, an etching selectivity of the second material layer with respect to the first material layer is 1 to 2.

In an embodiment of the invention, an etchant used in the third etching process includes halogen substituted or unsubstituted hydrocarbon.

The invention further provides a fabricating method of a semiconductor device. The fabricating method of the semiconductor device includes the following. A plurality of material layers are formed on a substrate, wherein the material layers include different materials. A mask layer is formed on the material layers. A first trench and a second trench are formed in the substrate by performing a plurality of etching processes using different etchants with the mask layer as a mask. At least a first angle and a second angle are formed between a sidewall of the second trench and a surface of the substrate, and a third angle and a fourth angle are formed between a sidewall of the first trench and the surface of the substrate. The first angle is an angle between an inner surface of an upper sidewall of the second trench and a first dividing line, the second angle is an angle between an inner surface of a lower sidewall of the second trench and a second dividing line, the third angle is an angle between an inner surface of an upper sidewall of the first trench and the first dividing line, and the fourth angle is an angle between an inner surface of a lower sidewall of the first trench and a third dividing line. The first dividing line is a line connecting dividing points between an upper portion and a lower portion of the second trench, the second dividing line is a line connecting a bottom of the second trench, and the third dividing line is a line connecting a bottom of the first trench. The first angle, the second angle, the third angle, and the fourth angle satisfy the following formula (1):

$$\text{Max}|\text{the third angle} - \text{the fourth angle}| < \text{Max}|\text{the first angle} - \text{the second angle}| \quad \text{formula (1).}$$

In an embodiment of the invention, the third angle is greater than the first angle and the second angle, and the fourth angle is greater than the first angle and the second angle.

The invention further provides a semiconductor device. The semiconductor device includes a substrate, a first pattern layer, and a second pattern layer. The substrate includes a first region and a second region. The second region is located in a periphery of the first region. The first region includes a plurality of first trenches under a surface of the substrate, and the second region includes a plurality of second trenches under the surface of the substrate. The first pattern layer is disposed on the surface of the substrate in the first region. The second pattern layer is disposed on the surface of the substrate in the second region. At least two different angles are formed between a sidewall of the second trench and the surface of the substrate.

In an embodiment of the invention, at least a first angle and a second angle are formed between the sidewall of the second trench and the surface of the substrate, and a third angle and a fourth angle are formed between a sidewall of the first trench and the surface of the substrate. The first angle is an angle between an inner surface of an upper sidewall of the second trench and a first dividing line, the second angle is an angle between an inner surface of a lower sidewall of the second trench and a second dividing line, the third angle is an angle between an inner surface of an upper sidewall of the first trench and the first dividing line, and the fourth angle is an angle between an inner surface of a lower sidewall of the first trench and a third dividing line. The first dividing line is a line connecting dividing points between an upper portion and a lower portion of the second trench, the second dividing line is a line connecting bottoms of the second trenches, and the third dividing line is a line connecting bottoms of the first trenches. The first angle, the second angle, the third angle, and the fourth angle satisfy the following formula (1):

$$\text{Max}|\text{the third angle} - \text{the fourth angle}| < \text{Max}|\text{the first angle} - \text{the second angle}| \quad \text{formula (1).}$$

In an embodiment of the invention, the first angle is greater than the second angle.

In an embodiment of the invention, the third angle is greater than the first angle and the second angle, and the fourth angle is greater than the first angle and the second angle.

In an embodiment of the invention, a fifth angle and a sixth angle are formed between a sidewall of the second pattern layer and the surface of the substrate, and the fifth angle is different from the sixth angle. The fifth angle is an angle between an inner surface of an upper sidewall of the second pattern layer and a fourth dividing line, and the sixth angle is an angle between an inner surface of a lower sidewall of the second pattern layer and a fifth dividing line. The fourth dividing line is a line connecting dividing points between an upper portion and a lower portion of the second pattern layer, and the fifth dividing line is a line connecting an interface between the first material layer and the first pattern layer, and an interface between a first material layer and the second pattern layer. The first material layer is between the substrate and the first patterned layer and between the substrate and the second patterned layer.

In an embodiment of the invention, the fifth angle is smaller than the sixth angle.

In an embodiment of the invention, the sidewall of the first trench includes a first shoulder portion, and the sidewall of the second trench includes a second shoulder portion. The first shoulder portion is closer to a first material layer than the second shoulder portion. The first material layer is between the substrate and the first patterned layer and between the substrate and the second patterned layer.

Based on the above, the fabricating method of the semiconductor device of the invention forms the trenches having similar contours in the dense region and the peripheral region of the device with fewer patterning processes. With this method, the trenches for fabricating the isolation structure are formed by performing fewer lithography processes, so as to prevent the problem of inaccurate alignment that results from performing the lithography processes many times.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

FIG. 1A to FIG. 1F are schematic cross-sectional views illustrating a fabricating method of a semiconductor device according to an embodiment of the invention.

Figure 1A:
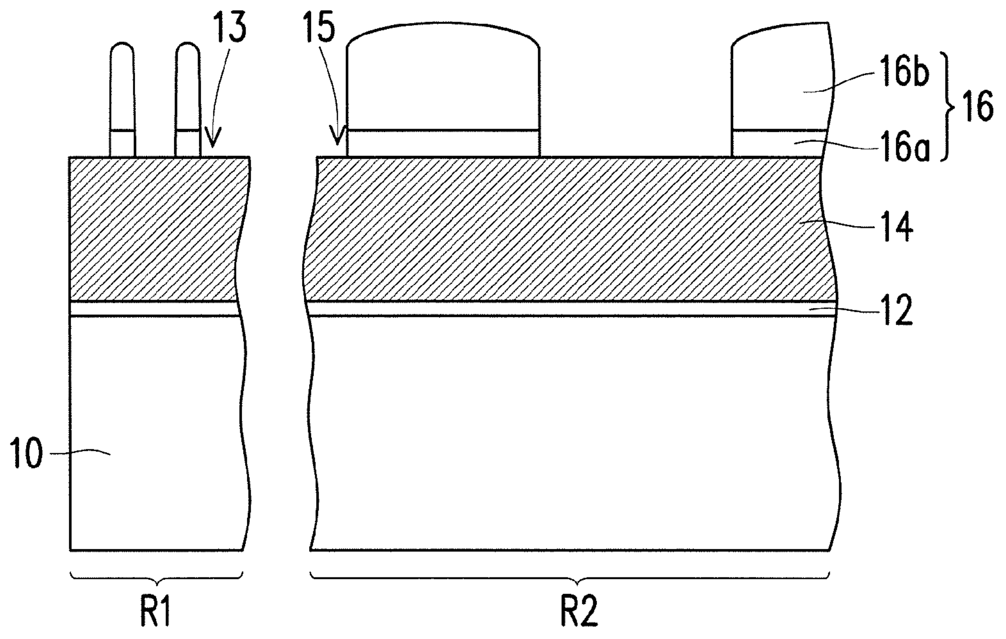
FIG. 1A to FIG. 1F are schematic cross-sectional views illustrating a fabricating method of a semiconductor device according to an embodiment of the invention.

With reference to FIG. 1A, a substrate 10 is provided first. The substrate 10 includes a first region R1 and a second region R2. The second region R2 is located in the periphery of the first region R1. In an embodiment, the first region R1 is a dense region of the semiconductor device and the second region R2 is a peripheral region of the semiconductor device, for example. The substrate 10 may include a semiconductor material, an insulator material, a conductor material, or any combination of the foregoing materials. The material of the substrate 10 is a material composed of at least one selected from a group consisting of Si, Ge, SiGe, GaP, GaAs, SiC, SiGeC, InAs, and InP, or any physical structure suitable for a fabricating process of the invention, for example. The substrate 10 includes a single-layer structure or a multi-layer structure. In addition, a silicon on insulator (SOI) substrate may be used as the substrate 10. The substrate 10 is silicon or silicon germanium, for example.

With reference to FIG. 1A again, next, a first material layer 12 is formed on the substrate 10 in the first region R1 and the second region R2. A material of the first material layer 12 is oxide, nitride, or a combination thereof, for example. The oxide is silicon oxide, for example. The nitride is silicon nitride, for example. A thickness of the first material layer 12 is in a range of 70 Å to 100 Å, for example. A method of forming the first material layer 12 includes performing chemical vapor deposition, for example.

Reverting to FIG. 1A, thereafter, a second material layer 14 is formed on the first material layer 12. A material of the second material layer 14 is different from the material of the first material layer 12. The second material layer 14 includes an undoped semiconductor or a doped semiconductor, such as polysilicon or doped polysilicon. A thickness of the second material layer 14 is in a range of 800 Å to 1500 Å, for example. A method of forming the second material layer 14 includes performing chemical vapor deposition, for example.

With reference to FIG. 1A again, next, a mask layer 16 is formed on the second material layer 14. In an embodiment, the mask layer 16 includes a dielectric anti-reflective coating film (DARC) 16*a* and an advanced patterning film (APF) 16*b*. The dielectric anti-reflective coating film 16*a* is disposed on the second material layer 14. The advanced patterning film 16*b* is disposed on the dielectric anti-reflective coating film 16*a*. A material of the dielectric anti-reflective coating film 16*a* is silicon oxynitride, silicon nitride, or a combination thereof, for example. A material of the advanced patterning film 16*b* is amorphous carbon, for example. A thickness of the dielectric anti-reflective coating film 16*a* is in a range of 150 Å to 500 Å, for example. A thickness of the advanced patterning film 16*b* is in a range of 1500 Å to 3000 Å, for example. A method of forming the dielectric anti-reflective coating film 16*a* and the advanced patterning film 16*b* includes performing chemical vapor deposition, for example. The mask layer 16 has a plurality of first openings 13 and a plurality of second openings 15. The first openings 13 are located above the first region R1 while the second openings 15 are located above the second region R2.

Figure 1B:
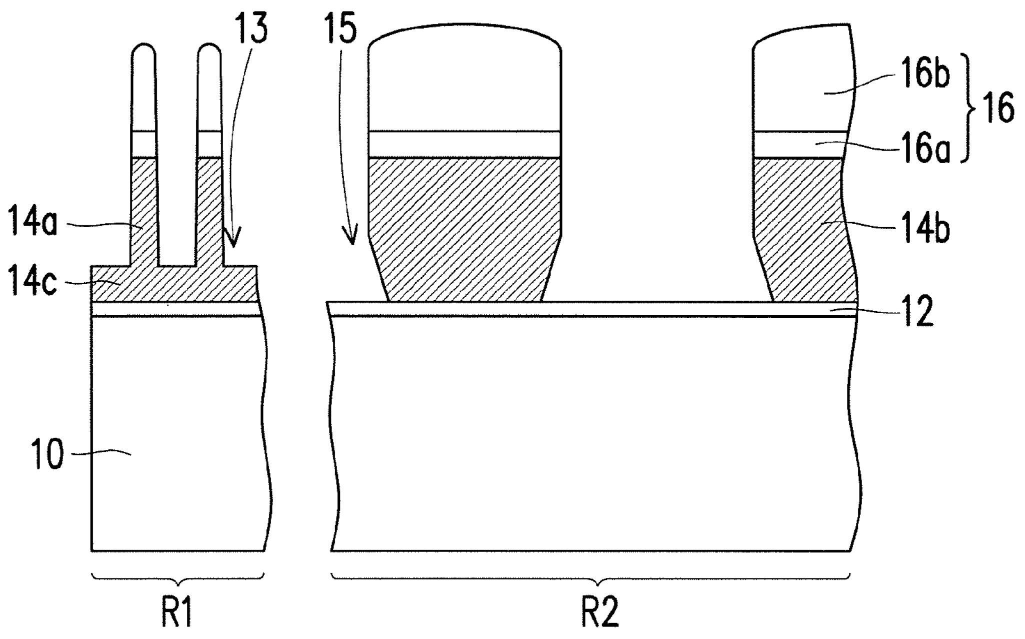

With reference to FIG. 1B, a portion of the second material layer 14 exposed by the first openings 13 and the second openings 15 is removed by performing a first etching process (or called a main etching process) with the mask layer 16 as a mask until the first material layer 12 is completely exposed, so as to form a first pattern layer 14*a* in the first region R1 and a second pattern layer 14*b* in the second region R2. It should be mentioned that the patterns to be formed in the second region R2 (the peripheral region) have lower density. Due to the loading effect, an etching rate of the second material layer 14 in the second region R2 is greater than an etching rate of the second material layer 14 in the first region R1. Therefore, when a surface of the first material layer 12 in the second region R2 is exposed, the first material layer 12 in the first region R1 (the dense region) is still covered by the first pattern layer 14*a* and a remaining second material layer 14*c* and is not exposed yet. Because the first material layer 12 in the second region R2 has been exposed, as the first etching process performed on the second material layer 14*c* continues, a sidewall of a lower portion of the second pattern layer 14*b* is etched. As a result, the sidewall of the second pattern layer 14*b* has at least two different angles. In contrast, the sidewall of the first pattern layer 14*a* has one angle. In an embodiment, the first etching process continues for 5 seconds to 15 seconds after the first material layer 12 is exposed.

A pressure used in the first etching process is 4 mTorr to 50 mTorr in an embodiment, 8 mTorr to 45 mTorr in another embodiment, and 10 mTorr to 35 mTorr in yet another embodiment. In the first etching process, if transformer coupled plasma is used, a power thereof is 600 W to 2000 W in an embodiment, 750 W to 1500 W in another embodiment, and 1050 W to 1350 W in yet another embodiment. If bias plasma is used, the power thereof is 30 W to 200 W in an embodiment, 50 W to 120 W in another embodiment, and 65 W to 105 W in yet another embodiment. An etchant used in the first etching process includes $Cl_2$, HBr, $CF_4$, $O_2$, $SF_6$, and $NF_3$. In an embodiment, the flow of $Cl_2$ is 10 sccm to 300 sccm; the flow of HBr is 10 sccm to 500 sccm; the flow of $CF_4$ is 10 sccm to 100 sccm; the flow of $O_2$ is 3 sccm to 100 sccm; the flow of $SF_6$ is 0 sccm to 100 sccm; and the flow of $NF_3$ is 0 sccm to 100 sccm. In another embodiment, the flow of $Cl_2$ is 50 sccm to 250 sccm; the flow of HBr is 150 sccm to 400 sccm; the flow of $CF_4$ is 15 sccm to 55 sccm; the flow of $O_2$ is 5 sccm to 30 sccm; the flow of $SF_6$ is 5 sccm to 50 sccm; and the flow of $NF_3$ is 5 sccm to 50 sccm. In yet another embodiment, the flow of $Cl_2$ is 75 sccm to 150 sccm; the flow of HBr is 20 sccm to 45 sccm; the flow of $O_2$ is 10 sccm to 20 sccm; the flow of $SF_6$ is 10 sccm to 25 sccm; and the flow of $NF_3$ is 10 sccm to 25 sccm.

Figure 1C:
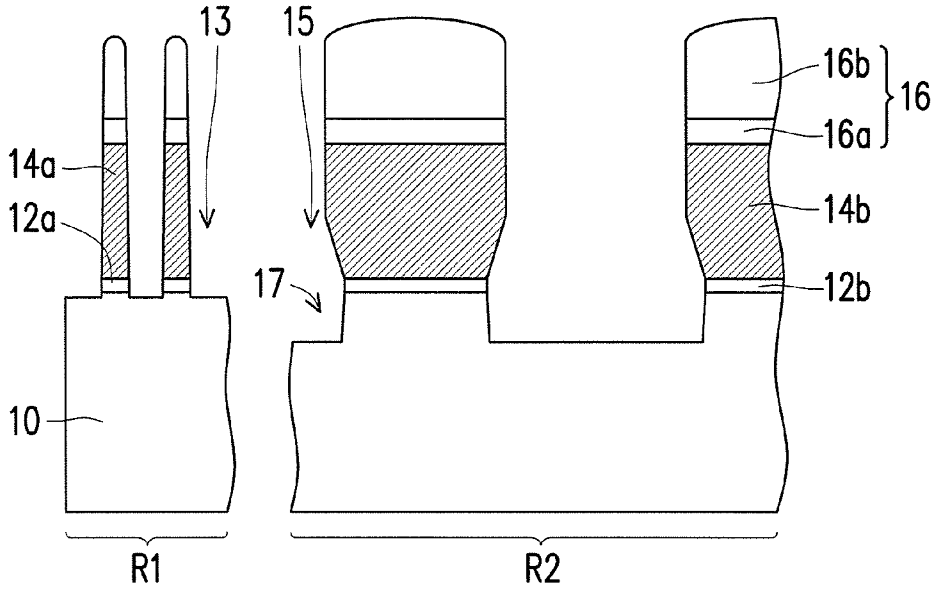

With reference to FIG. 1C, the second material layer 14*c* remaining in the first region R1, a portion of the first material layer 12 in the first region R1, and a portion of the first material layer 12 in the second region R2 are removed by performing a second etching process (or called a transitional etching process) with the mask layer 16 as a mask, so as to expose a portion of the substrate 10 and form first material layers 12*a* and 12*b*. It should be noted that, due to the loading effect, an etching rate of the first material layer 12 in the second region R2 (the peripheral region) is greater than an etching rate of the first material layer 12 in the first region R1 (the dense region). Moreover, because the difference between the etching rates of the first material layer 12 and the substrate 10 is insignificant (for example, an etching selectivity of the first material layer 12/the substrate 10 is about 1 to 2), the second etching process also removes a portion of the substrate 10 in the second region R2 to form a recess 17.

A pressure used in the second etching process is 5 mTorr to 50 mTorr in an embodiment, 8 mTorr to 40 mTorr in another embodiment, and 12 mTorr to 35 mTorr in yet another embodiment. In the second etching process, if transformer coupled plasma is used, a power thereof is 150 W to 1050 W in an embodiment, 200 W to 650 W in another embodiment, and 250 W to 550 W in yet another embodiment. If bias plasma is used, the power thereof is 30 W to 200 W in an embodiment, 50 W to 120 W in another embodiment, and 65 W to 105 W in yet another embodiment. In an embodiment, an etchant used in the second etching process has an etching selectivity of 1 to 2 (the second material layer 14*c*/the first material layer 12). The etchant used in the second etching process is different from the etchant used in the first etching process. The etchant used in the second etching process includes $CF_4$, $CHF_3$, $CH_2F_2$, $N_2$, $O_2$, $SF_6$, and $NF_3$. In an embodiment, the flow of $CF_4$ is 10 sccm to 200 sccm; the flow of $CHF_3$ is 10 sccm to 200 sccm; the flow of $CH_2F_2$ is 0 sccm to 50 sccm; the flow of $N_2$ is 10 sccm to 100 sccm; the flow of $O_2$ is 3 sccm to 100 sccm; the flow of $SF_6$ is 0 sccm to 100 sccm; and the flow of $NF_3$ is 0 sccm to 100 sccm. In another embodiment, the flow of $CF_4$ is 30 sccm to 150 sccm; the flow of $CHF_3$ is 30 sccm to 150 sccm; the flow of $CH_2F_2$ is 10 sccm to 30 sccm; the flow of $N_2$ is 25 sccm to 80 sccm; the flow of $O_2$ is 5 sccm to 30 sccm; the flow of $SF_6$ is 5 sccm to 50 sccm; and the flow of $NF_3$ is 5 sccm to 50 sccm. In yet another embodiment, the flow of $CF_4$ is 50 sccm to 120 sccm; the flow of $CHF_3$ is 50 sccm to 120 sccm; the flow of $CH_2F_2$ is 15 sccm to 25 sccm; the flow of $N_2$ is 35 sccm to 70 sccm; the flow of $O_2$ is 10 sccm to 20 sccm; the flow of $SF_6$ is 10 sccm to 25 sccm; and the flow of $NF_3$ is 10 sccm to 25 sccm.

Figure 1D:
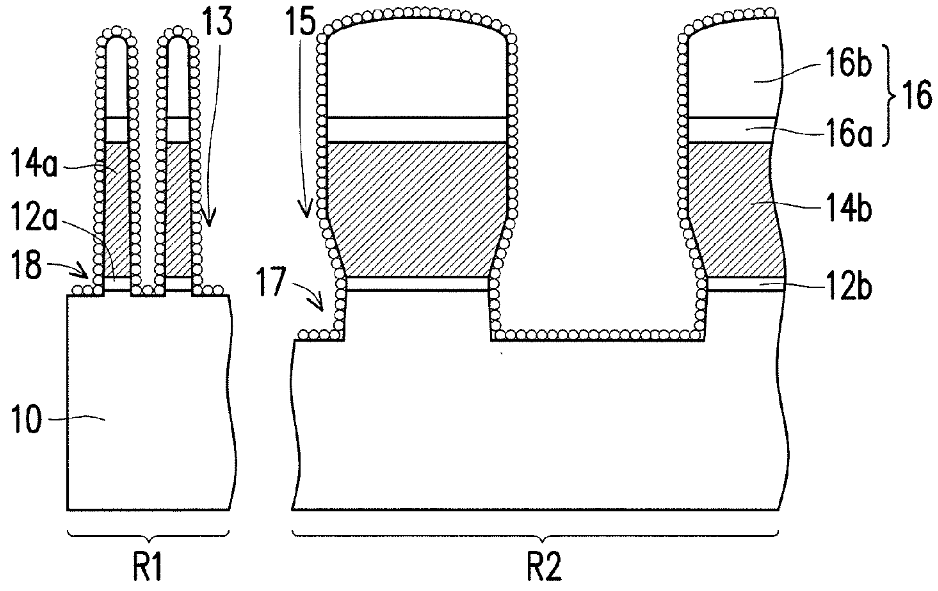
Figure 1E:
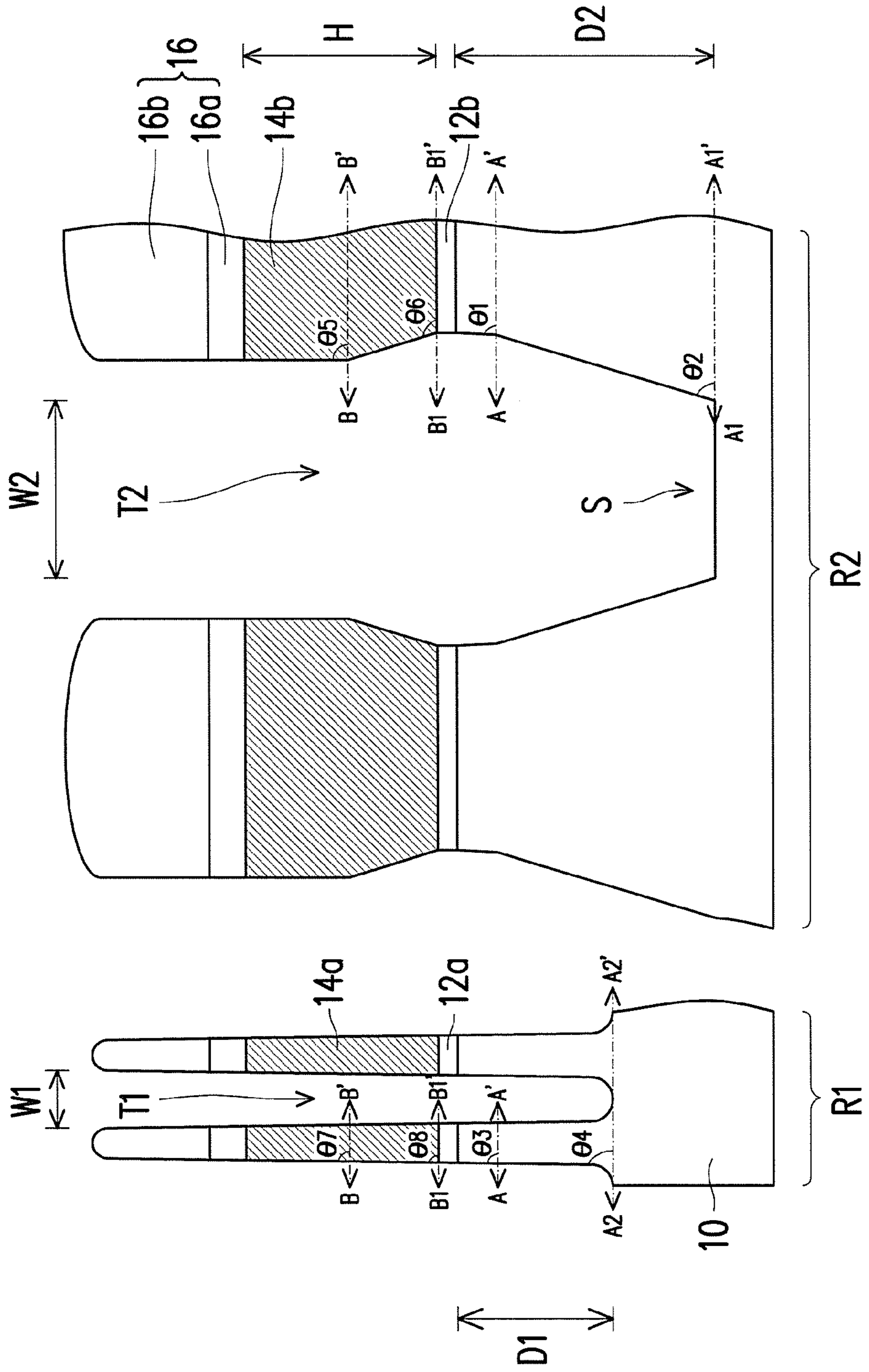

With reference to FIG. 1D and FIG. 1E, then, a portion of the substrate 10 is removed by performing a third etching process with the mask layer 16 as a mask, so as to form a plurality of first trenches T1 and a plurality of second trenches T2 in the substrate 10. The first trenches T1 are located in the substrate 10 on two sides of the first pattern layer 14*a* in the first region R1 (the dense region); and the second trenches T2 are located in the substrate 10 on two sides of the second pattern layer 14*b* in the second region R2 (the peripheral region).

A pressure used in the third etching process is 5 mTorr to 50 mTorr in an embodiment, 8 mTorr to 40 mTorr in another embodiment, and 12 mTorr to 30 mTorr in yet another embodiment. If transformer coupled plasma is used, a power thereof is 150 W to 1050 W in an embodiment, 200 W to 650 W in another embodiment, and 250 W to 550 W in yet another embodiment. If bias plasma is used, the power thereof is 80 W to 350 W in an embodiment, 120 W to 300 W in another embodiment, and 180 W to 255 W in yet another embodiment. An etchant used in the third etching process is different from the etchant used in the first etching process and different from the etchant used in the second etching process. The etchant used in the third etching process is halogen substituted hydrocarbon, for example. The hydrocarbon is alkane, alkene, alkyne, or a combination thereof, for example. The halogen is fluorine, chlorine, bromine, or a combination thereof, for example. The halogen substituted hydrocarbon generates more polymers, so as to raise the etching selectivity. In an embodiment, the halogen substituted hydrocarbon used in the third etching process may be $CH_xF_y$, $CH_x$, $C_xF_y$, or a combination thereof (wherein x is 0-4 and y is 0-8). Specifically, the etchant used in the third etching process includes HBr, $Cl_2$, $CF_4$, $CHF_3$, $CH_2F_2$, $N_2$, $O_2$, $SF_6$, and $NF_3$. In an embodiment, the flow of HBr is 10 sccm to 500 sccm; the flow of $Cl_2$ is 10 sccm to 50 sccm; the flow of $CF_4$ is 10 sccm to 50 sccm; the flow of $CHF_3$ is 10 sccm to 50 sccm; the flow of $CH_2F_2$ is 0 sccm to 50 sccm; the flow of $N_2$ is 10 sccm to 100 sccm; the flow of $O_2$ is 3 sccm to 50 sccm; the flow of $SF_6$ is 0 sccm to 100 sccm; and the flow of $NF_3$ is 0 sccm to 100 sccm. In another embodiment, the flow of HBr is 150 sccm to 400 sccm; the flow of $Cl_2$ is 15 sccm to 40 sccm; the flow of $CF_4$ is 15 sccm to 45 sccm; the flow of $CHF_3$ is 15 sccm to 45 sccm; the flow of $CH_2F_2$ is 10 sccm to 45 sccm; the flow of $N_2$ is 25 sccm to 80 sccm; the flow of $O_2$ is 5 sccm to 30 sccm; the flow of $SF_6$ is 5 sccm to 50 sccm; and the flow of $NF_3$ is 5 sccm to 50 sccm. In yet another embodiment, the flow of HBr is 200 sccm to 380 sccm; the flow of $Cl_2$ is 18 sccm to 30 sccm; the flow of $CF_4$ is 18 sccm to 35 sccm; the flow of $CHF_3$ is 18 sccm to 35 sccm; the flow of $CH_2F_2$ is 15 sccm to 40 sccm; the flow of $N_2$ is 35 sccm to 70 sccm; the flow of $O_2$ is 7 sccm to 20 sccm; the flow of $SF_6$ is 10 sccm to 25 sccm; and the flow of $NF_3$ is 10 sccm to 25 sccm.

Since the etchant used in the third etching process is halogen substituted hydrocarbon, a layer of polymers 18 deposits on the surfaces of the first region R1 and the second region R2 during the etching. The polymers 18 are conducive to forming the trenches having similar contours in the first region R1 (the dense region) and the second region R2 (the peripheral region) of the device. Therefore, by such a method, the trenches for forming the isolation structure are formed with fewer lithography processes, so as to prevent the problem of inaccurate alignment that results from performing the lithography processes many times.

With reference to FIG. 1E, in the structure formed by the first etching process, the second etching process, and the third etching process as described above, the first pattern layer 14*a* and the first material layer 12*a* are formed on the surface of the substrate 10 in the first region R1. A plurality of first trenches T1 are formed under the surface of the substrate 10 in the first region R1. The second pattern layer 14*b* and the first material layer 12*b* are formed on the surface of the substrate 10 in the second region R2. A plurality of second trenches T2 are formed under the surface of the substrate 10 in the second region R2. The first region R1 is a memory cell region; the first pattern layer 14*a* serves as a gate or a floating gate; and the first material layer 12*a* serves as a gate dielectric layer or a tunneling dielectric layer, for example. The second region R2 is a peripheral circuit region, the second pattern layer 14*b* serves as a gate, and the first material layer 12*b* serves as a gate dielectric layer, for example.

With reference to FIG. 1E, the contour of the second trench T2 is different from the contour of the first trench T1. The second trench T2 has a relatively flat bottom while the first trench T1 has a relatively round bottom. The contour of the sidewall of the second trench T2 has obvious corners while the contour of the sidewall of the first trench T1 has no obvious turning point or has no turning point. More specifically, the sidewall of the second trench T2 and a surface S of the substrate 10 form at least two different angles. In an embodiment, at least a first angle θ1 and a second angle θ2 are formed between the sidewall of the second trench T2 and the surface S of the substrate 10, and a third angle θ3 and a fourth angle θ4 are formed between the sidewall of the first trench T1 and the surface S of the substrate 10. The first angle θ1 is an angle between an inner surface of an upper sidewall of the second trench T2 and a first dividing line A-A'; the second angle θ2 is an angle between an inner surface of a lower sidewall of the second trench T2 and a second dividing line A1-A1'; the third angle θ3 is an angle between an inner surface of an upper sidewall of the first trench T1 and the first dividing line A-A'; and the fourth angle θ4 is an angle between an inner surface of a lower sidewall of the first trench T1 and a third dividing line A2-A2'. The first dividing line A-A' is a line connecting dividing points between an upper portion and a lower portion of the second trench T2; the second dividing line A1-A1' is a line connecting the bottoms of the second trenches T2; and the third dividing line A2-A2' is a line connecting the bottoms of the first trenches T1. The first angle θ1, the second angle θ2, the third angle θ3, and the fourth angle θ4 satisfy the following formula (1):

$$\mathrm{Max}|\theta 3-\theta 4|<\mathrm{Max}|\theta 1-\theta 2 \quad \text{formula (1)}$$

Max represents the maximum value. The upper portion and the lower portion of the first trench T1 and the upper portion and the lower portion of the second trench T2 are divided by a top of the substrate 10, for example, and the dividing point is 10% to 50% of a depth D2 of the second trench T2 (as indicated by the line A-A' of FIG. 1E). In an embodiment, the first angle θ1 is greater than the second angle θ2. The first angle θ1 is in a range of 48 degrees to 90 degrees, for example. The second angle θ2 is in a range of 45 degrees to 89 degrees, for example. The third angle θ3 and the fourth angle θ4 are respectively in a range of 80 degrees to 89 degrees, for example. The third angle θ3 and the fourth angle θ4 may be the same or different. In an embodiment, the third angle θ3 and the fourth angle θ4 are substantially equal. The reason why at least two different angles are formed between the sidewall of the second trench T2 and the surface S of the substrate 10 is that: due to the loading effect, the etching rate of the first material layer 12 in the second region R2 is higher in the second etching process; thus, the second etching process also removes a portion of the substrate 10 in the second region R2 and forms the recess 17. When the third etching process is performed, not only the bottom of the recess 17 is etched, the sidewall of the recess 17 is also etched. Therefore, after the third etching process is performed, at least two different angles (θ1 and θ2 as shown in FIG. 1E) are formed between the sidewall of the second trench T2 and the surface S of the substrate 10.

With reference to FIG. 1E again, in the structure formed by the first etching process, the second etching process, and the third etching process as described above, a fifth angle θ5 and a sixth angle θ6 are formed between the sidewall of the second pattern layer **14*b* and the surface S of the substrate 10. A seventh angle θ7 and an eighth angle θ8 are formed between the sidewall of the first pattern layer 14*a* and the surface S of the substrate 10. The fifth angle θ5 is an angle between an inner surface of an upper sidewall of the second pattern layer 14*b* and a fourth dividing line B-B'; the sixth angle θ6 is an angle between an inner surface of a lower sidewall of the second pattern layer 14*b* and a fifth dividing line B1-B1'; the seventh angle θ7 is an angle between an inner surface of an upper sidewall of the first pattern layer 14*a* and the fourth dividing line B-B'; and the eighth angle θ8 is an angle between an inner surface of a lower sidewall of the first pattern layer 14*a* and the fifth dividing line B1-B1'. The fourth dividing line B-B' is a line connecting dividing points between an upper portion and a lower portion of the second pattern layer 14*b*; the fifth dividing line B1-B1' is a line connecting an interface between the first material layer 12*a* and the first pattern layer 14*a*, and an interface between the first material layer 12*b* and the second pattern layer 14*b*. The upper portion and the lower portion of the first pattern layer 14*a* and the upper portion and the lower portion of the second pattern layer 14*b* are divided by the bottom of the second pattern layer 14*b*, for example, and the dividing point is 20% to 70% of a height H from the bottom of the second pattern layer 14*b* (as indicated by the line B-B' of FIG. 1**E).

The fifth angle θ5 is different from the sixth angle θ6. In an embodiment, the fifth angle θ5 is smaller than the sixth angle θ6. In an embodiment, the third angle θ3 is greater than the first angle θ1. In another embodiment, the fourth angle θ4 is greater than the second angle θ2. In yet another embodiment, the eighth angle θ8 is smaller than the sixth angle θ6. The fifth angle θ5 is equal to or less than 90 degrees, for example. In an embodiment, the fifth angle θ5 is in a range of 82 degrees to 90 degrees. In an embodiment, the fifth angle θ5 is in a range of 86 degrees to 88 degrees. The sixth angle θ6 is greater than 90 degrees, for example. In an embodiment, the sixth angle θ6 is in a range of 90 degrees to 106 degrees. In another embodiment, the sixth angle θ6 is in a range of 90 degrees to 93 degrees. The seventh angle θ7 and the eighth angle θ8 are respectively equal to or less than 90 degrees, for example. In an embodiment, the seventh angle θ7 and the eighth angle θ8 are respectively in a range of 82 degrees to 90 degrees, for example. In another embodiment, the seventh angle θ7 and the eighth angle θ8 are respectively in a range of 86 degrees to 88 degrees, for example. The seventh angle θ7 and the eighth angle θ8 may be the same or different. In an embodiment, the seventh angle θ7 and the eighth angle θ8 are substantially equal. The reason why the sidewall of the second pattern layer **14*b* has two different angles may be that: due to the loading effect, the etching rate of the second material layer 14 in the second region R2 (the peripheral region) is higher in the first etching process; thus, when the first material layer 12 in the second region R2 is exposed, the first material layer 12 in the first region R1 (the dense region) has remaining material layer thereon (14*c* as shown in FIG. 1B). Since the first material layer 12 in the second region R2 is already exposed, as the etching of the remaining material layer continues, the sidewall of the lower portion of the second pattern layer 14*b* is etched. As a result, the sidewall of the second pattern layer 14*b* has two different angles (05 and 06 as shown in FIG. 1**E).

Reverting to FIG. 1E, the depth D2 of the second trench T2 is greater than a depth D1 of the first trench T1. In an embodiment, the depth D2 of each second trench T2 is 1.1 to 4 times the depth D1 of each first trench T1. The depth D1 of the first trench T1 is in a range of 1300 Å to 2000 Å, and the depth D2 of the second trench T2 is in a range of 1500 Å to 8000 Å, for example. The electrical performance of the semiconductor device can be controlled more easily by controlling the depth D2 of the second trench T2 to be 1.1 to 4 times the depth D1 of the first trench T1.

Reverting to FIG. 1E, a width W2 of the second trench T2 is greater than a width W1 of the first trench T1. In an embodiment, the width W2 of each second trench T2 is 2 to 1000 times the width W1 of each first trench T1. The width W1 of the first trench T1 is in a range of 1501 to 10001, and the width W2 of the second trench T2 is in a range of 300 Å to 1000000 Å, for example.

In addition, at least one angle may be formed between the sidewall of the first trench T1 and the surface S of the substrate 10, and at least two different angles may be formed between the sidewall of the second trench T2 and the surface S of the substrate 10. At least one more angle is formed between the sidewall of the second trench T2 and the surface S of the substrate 10 than between the sidewall of the first trench T1 and the surface S of the substrate 10.

Figure 1F:
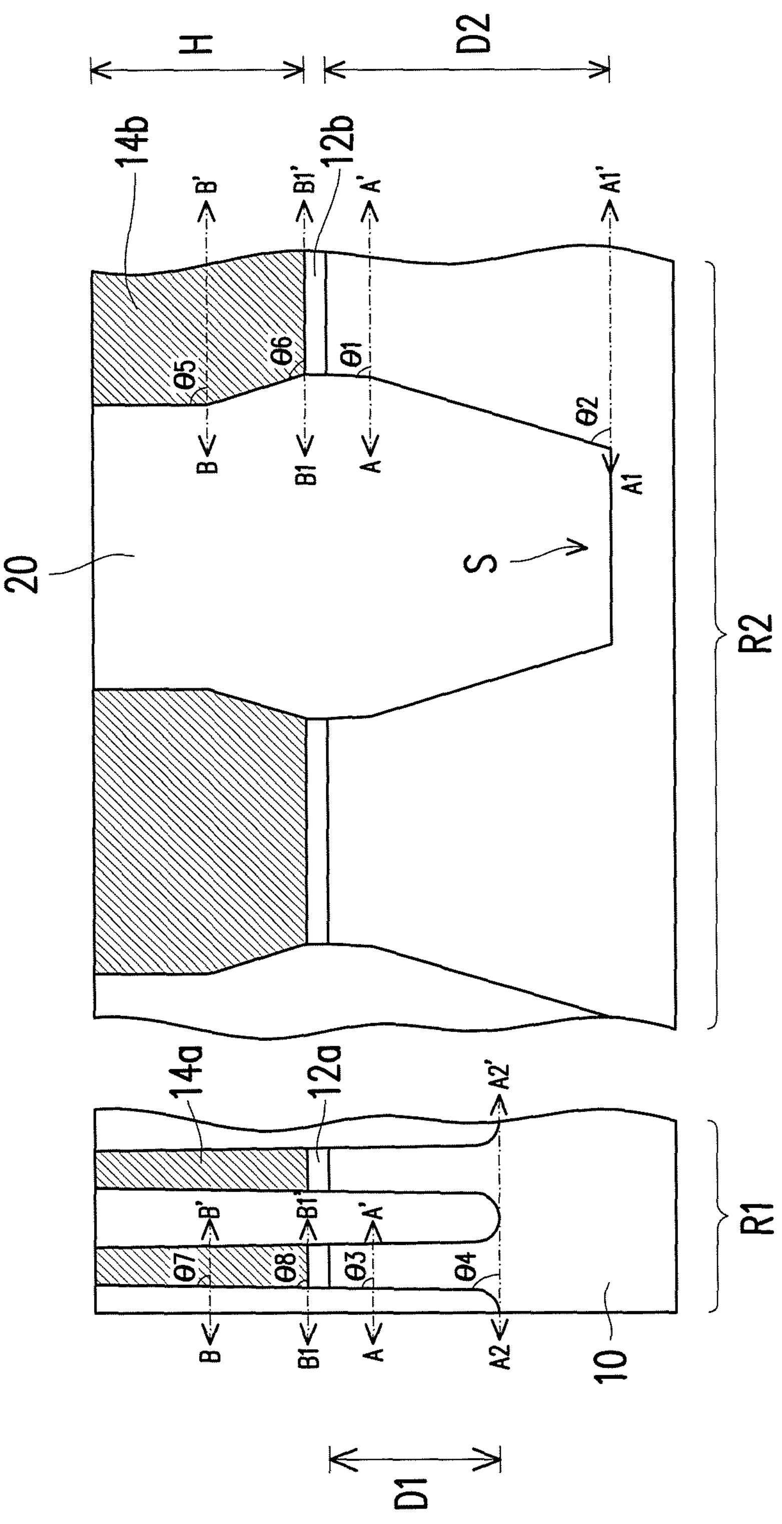

With reference to FIG. 1F, thereafter, an insulating layer 20 is formed to be filled into the first trenches T1 and the second trenches T2 and cover the sidewalls of the first pattern layer **14*a* and the second pattern layer 14*b*. A material of the insulating layer 20 includes oxide, nitride, or a combination thereof. A method of forming the insulating layer 20 includes performing chemical vapor deposition, for example. Following that, the mask layer 16 is removed. A method of removing the mask layer 16 includes dry stripping or wet stripping, for example. The insulating layer 20** may serve as the isolation structure.

The above embodiments illustrate using an etchant that can form polymers to perform the third etching process. However, the fabricating method of the semiconductor device of the invention is not limited thereto. The following paragraphs describe another embodiment of the invention. In the following paragraphs, descriptions of processes or components similar to those of the above embodiments will not be repeated.

Figure 2A:
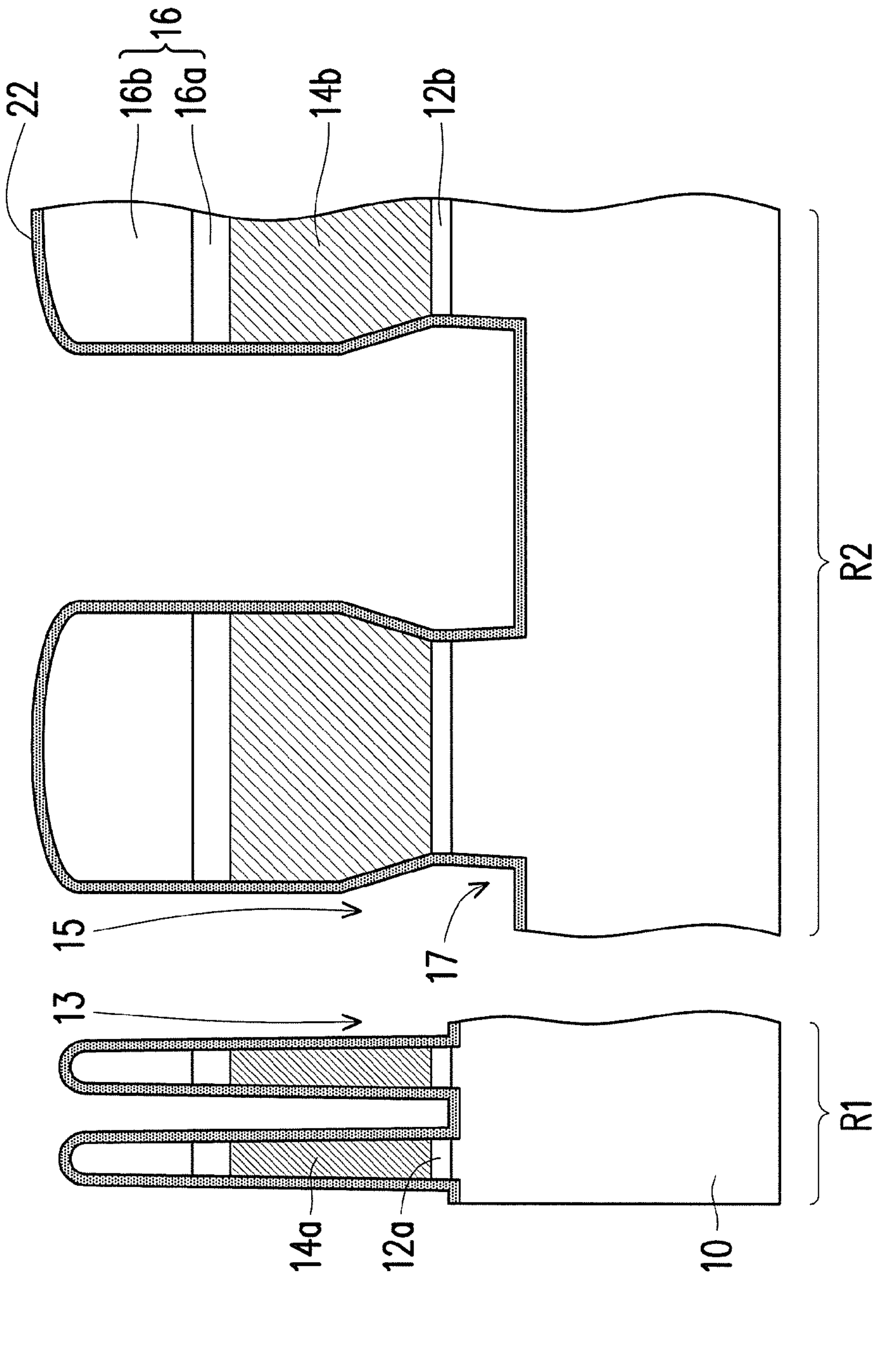
FIG. 2A to FIG. 2C are schematic cross-sectional views illustrating a fabricating method of a semiconductor device according to another embodiment of the invention.
Figure 2B:
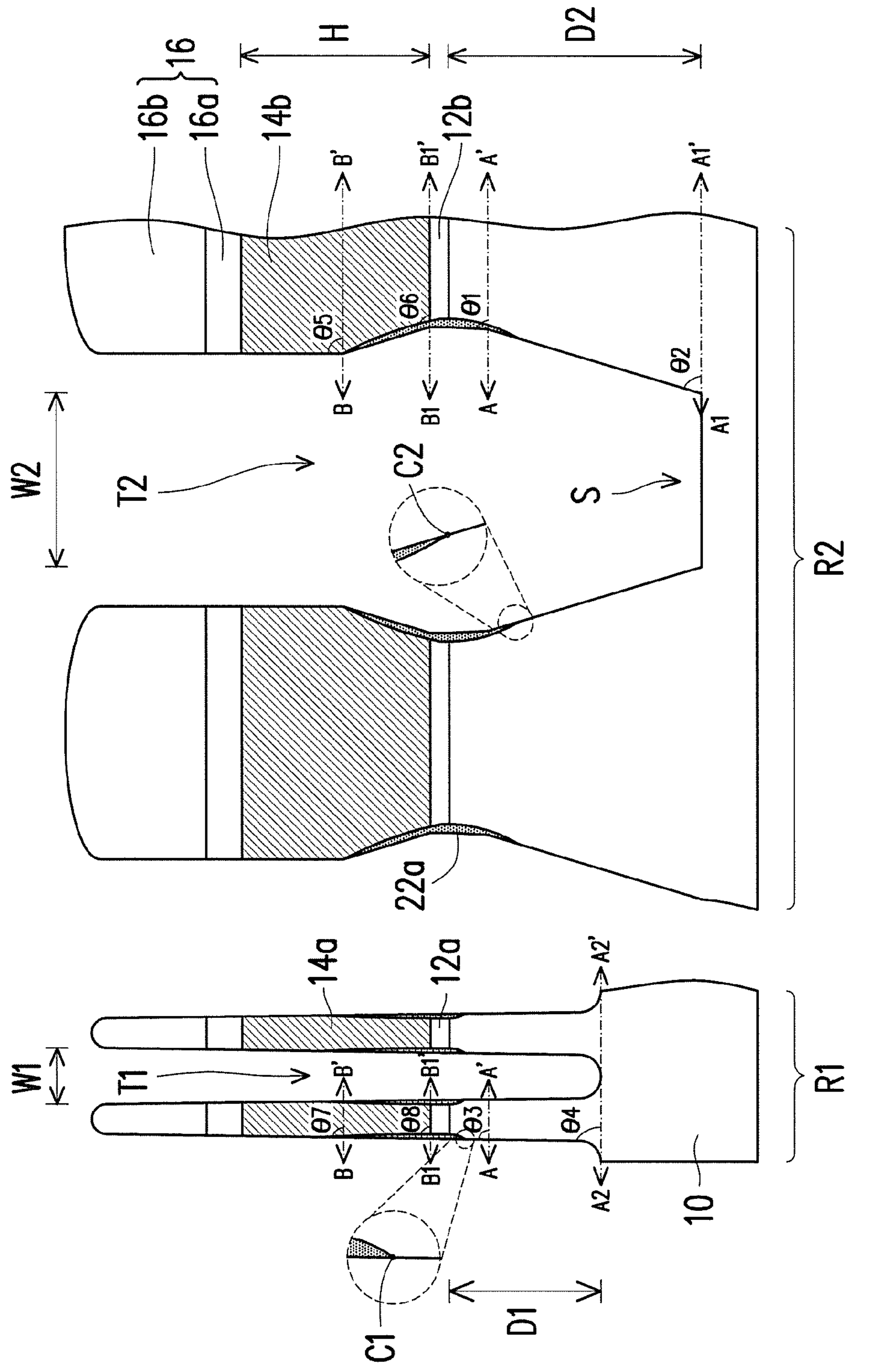
Figure 2C:
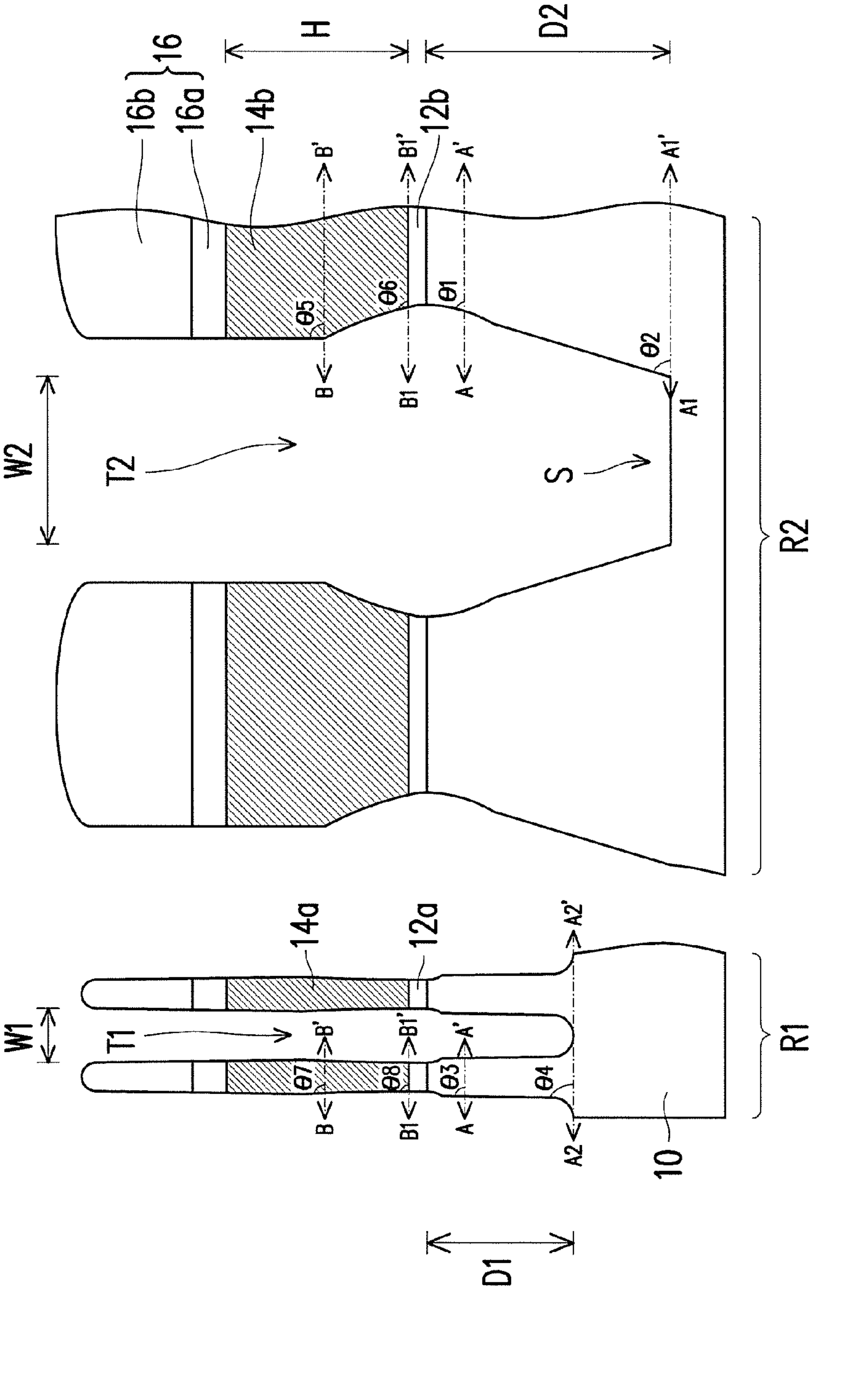

FIG. 2A to FIG. 2C are schematic cross-sectional views illustrating a fabricating method of a semiconductor device according to another embodiment of the invention.

With reference to FIG. 1A to FIG. 1C and FIG. 2A, the fabricating method of this embodiment is similar to the fabricating method of the above embodiments but different in that: after performing the second etching process and before performing the third etching process, a liner layer 22 is formed to cover the first pattern layer 14*a*, the second pattern layer 14*b*, the first material layers 12*a* and 12*b*, and the substrate 10. A material of the liner layer 22 includes silicon oxide, silicon nitride, silicon oxynitride, or a combination thereof, for example. A thickness of the liner layer 22 is in a range of 10 Å to 250 Å, for example. A method of forming the liner layer 22 includes performing chemical vapor deposition, for example.

With reference to FIG. 2A and FIG. 2B, then, a portion of the substrate 10 and a portion of the liner layer 22 are removed by performing the third etching process, so as to form a plurality of first trenches T1 and a plurality of second trenches T2 in the substrate 10. The second trenches T2 are located in the periphery of the first trenches T1. When the third etching process is performed, the liner layer 22 on the sidewall and surface of the mask layer 16, on the upper sidewall of the first pattern layer 14*a*, on the upper sidewall of the second pattern layer 14*b*, and at the bottom of the recess 17 is removed first. A remaining liner layer 22*a* covers the lower sidewall of the first pattern layer 14*a*, the lower sidewall of the second pattern layer 14*b*, the sidewalls of the first material layers 12*a* and 12*b*, and a partial sidewall of the substrate 10 in the second region R2. Because the liner layer 22 is formed before the third etching process is performed, the third etching process is carried out without forming the polymers. An etchant for removing a portion of the substrate 10 and a portion of the liner layer 22 includes $Cl_2$, HBr, or a combination thereof, for example.

With reference to FIG. 2C, next, the remaining liner layer 22*a* is removed. It should be noted that the remaining liner layer 22*a* may be retained till the subsequent processes. A method of removing the remaining liner layer 22*a* includes dry stripping or wet stripping, for example. Steps and details of forming the insulating layer 20 and removing the mask layer 16 thereafter have been specified in the above embodiments and thus are not repeated hereinafter.

A difference between this embodiment and the above embodiments is that: in the structure formed by performing the third etching process after forming the liner layer 22, the sidewall of the first trench T1 has a first shoulder portion C1 and the sidewall of the second trench T2 has a second shoulder portion C2. In an embodiment, the first shoulder portion C1 is closer to the first material layers 12*a* and 12*b* than the second shoulder portion C2. In another embodiment, the first shoulder portion C1 and the second shoulder portion C2 have a difference of 10 nm to 200 nm in a depth direction of the first trench T1 and the second trench T2. In an embodiment, with the top of the substrate 10 as a starting point, the first shoulder portion C1 is at a position of 3% to 20% of the depth D1 of the first trench T1, and the second shoulder portion C2 is at a position of 5% to 45% of the depth D2 of the second trench T2.

To conclude the above, the fabricating method of the semiconductor device of the invention uses the etchant or the liner layer for forming the polymers, so as to form the trenches having similar contours in the dense region and the peripheral region of the device with fewer patterning processes. With this method, the trenches for fabricating the isolation structure are formed by performing fewer lithography processes, so as to prevent the problem of inaccurate alignment that results from performing the lithography processes many times.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A fabricating method of a semiconductor device, the fabricating method comprising:

forming a plurality of material layers on a substrate, wherein the material layers comprise different materials;

forming a mask layer on the material layers; and forming a first trench and a second trench in the substrate by performing a plurality of etching processes using different etchants with the mask layer as a mask, wherein at least a first angle and a second angle are formed between a sidewall of the second trench and a surface of the substrate, and a third angle and a fourth angle are formed between a sidewall of the first trench and the surface of the substrate, wherein the first angle is an angle between an inner surface of an upper sidewall of the second trench and a first dividing line, the second angle is an angle between an inner surface of a lower sidewall of the second trench and a second dividing line, the third angle is an angle between an inner surface of an upper sidewall of the first trench and the first dividing line, and the fourth angle is an angle between an inner surface of a lower sidewall of the first trench and a third dividing line, and wherein the first dividing line is a line connecting dividing points between an upper portion and a lower portion of the second trench, the second dividing line is a line connecting a bottom of the second trench, and the third dividing line is a line connecting a bottom of the first trench, wherein the first angle, the second angle, the third angle, and the fourth angle satisfy the following formula (1):

Max the third angle−the fourth angle|<Max|the first angle−the second angle| formula (1).

2. The fabricating method according to claim 1, wherein the third angle is greater than the first angle and the second angle, and the fourth angle is greater than the first angle and the second angle.

3. A semiconductor device, comprising:

a substrate comprising a first region and a second region located in a periphery of the first region, wherein the first region comprises a plurality of first trenches under a surface of the substrate, and the second region comprises a plurality of second trenches under the surface of the substrate;

a first pattern layer disposed on the surface of the substrate in the first region; and a second pattern layer disposed on the surface of the substrate in the second region, wherein at least two different angles are formed between a sidewall of the second trench and the surface of the substrate, wherein at least a first angle and a second angle are formed between the sidewall of the second trench and the surface of the substrate, and a third angle and a fourth angle are formed between a sidewall of the first trench and the surface of the substrate, wherein the first angle is an angle between an inner surface of an upper sidewall of the second trench and a first dividing line, the second angle is an angle between an inner surface of a lower sidewall of the second trench and a second dividing line, the third angle is an angle between an inner surface of an upper sidewall of the first trench and the first dividing line, and the fourth angle is an angle between an inner surface of a lower sidewall of the first trench and a third dividing line, and wherein the first dividing line is a line connecting dividing points between an upper portion and a lower portion of the second trench, the second dividing line is a line connecting bottoms of the second trenches, and the third dividing line is a line connecting bottoms of the first trenches, wherein the first angle, the second angle, the third angle, and the fourth angle satisfy the following formula (1):

$$\text{Max the third angle} - \text{the fourth angle}| < \text{Max}|\text{the first angle} - \text{the second angle} \qquad \text{formula (1).}$$

4. The semiconductor device according to claim 3, wherein the first angle is greater than the second angle.

5. The semiconductor device according to claim 3, wherein the third angle is greater than the first angle and the second angle, and the fourth angle is greater than the first angle and the second angle.

6. The semiconductor device according to claim 3, wherein a fifth angle and a sixth angle are formed between a sidewall of the second pattern layer and the surface of the substrate, and the fifth angle is different from the sixth angle, wherein the fifth angle is an angle between an inner surface of an upper sidewall of the second pattern layer and a fourth dividing line, and the sixth angle is an angle between an inner surface of a lower sidewall of the second pattern layer and a fifth dividing line, and wherein the fourth dividing line is a line connecting dividing points between an upper portion and a lower portion of the second pattern layer, and the fifth dividing line is a line connecting an interface between a first material layer and the first pattern layer, and an interface between the first material layer and the second pattern layer, wherein the first material layer is between the substrate and the first patterned layer and between the substrate and the second patterned layer.

7. The semiconductor device according to claim 6, wherein the fifth angle is smaller than the sixth angle.

8. The semiconductor device according to claim 3, wherein the sidewall of the first trench comprises a first shoulder portion, and the sidewall of the second trench comprises a second shoulder portion, wherein the first shoulder portion is closer to a first material layer than the second shoulder portion, wherein the first material layer is between the substrate and the first patterned layer and between the substrate and the second patterned layer.

* * * * *